United States Patent
Hirakawa

(10) Patent No.: US 11,515,263 B2
(45) Date of Patent: Nov. 29, 2022

(54) METHOD OF PRODUCING LASER-MARKED SILICON WAFER AND LASER-MARKED SILICON WAFER

(71) Applicant: SUMCO Corporation, Tokyo (JP)

(72) Inventor: Yoichiro Hirakawa, Tokyo (JP)

(73) Assignee: SUMCO CORPORATION, Tokyo (JP)

(*) Notice: Subject to any disclaimer, the term of this patent is extended or adjusted under 35 U.S.C. 154(b) by 0 days.

(21) Appl. No.: 17/285,262

(22) PCT Filed: Sep. 6, 2019

(86) PCT No.: PCT/JP2019/035200
§ 371 (c)(1),
(2) Date: Apr. 14, 2021

(87) PCT Pub. No.: WO2020/084931
PCT Pub. Date: Apr. 30, 2020

(65) Prior Publication Data
US 2021/0375782 A1     Dec. 2, 2021

(30) Foreign Application Priority Data

Oct. 22, 2018  (JP) .............................. JP2018-198503

(51) Int. Cl.
*H01L 23/544*   (2006.01)
*H01L 21/02*    (2006.01)

(52) U.S. Cl.
CPC ...... *H01L 23/544* (2013.01); *H01L 21/02019* (2013.01); *H01L 21/02024* (2013.01); *H01L 2223/54433* (2013.01)

(58) Field of Classification Search
CPC ............. H01L 23/544; H01L 21/02019; H01L 21/02024; H01L 2223/54433;
(Continued)

(56) References Cited

U.S. PATENT DOCUMENTS

2008/0135981 A1   6/2008  Yamamoto
2011/0021025 A1*  1/2011  Hashii .................. H01L 23/544
                                              438/691

FOREIGN PATENT DOCUMENTS

JP   S59-84515 A    5/1984
JP   S60-206130 A  10/1985
(Continued)

OTHER PUBLICATIONS

Office Action dated Oct. 29, 2020 issued in Taiwanese patent application No. 10921043040 along with corresponding English translation.
(Continued)

*Primary Examiner* — Cuong B Nguyen
(74) *Attorney, Agent, or Firm* — Greenblum & Bernstein, P.L.C.

(57) ABSTRACT

A method of producing a silicon wafer includes: a laser mark printing step of printing a laser mark having a plurality of dots on a silicon wafer; an etching step of performing etching on at least a laser-mark printed region in a surface of the silicon wafer; and a polishing step of performing polishing on both surfaces of the silicon wafer having been subjected to the etching step. In the laser mark printing step, each of the plurality of dots is formed by a first step of irradiating a predetermined position on a periphery of the silicon wafer with laser light of a first beam diameter thereby forming a first portion of the dot and a second step of irradiating the predetermined position with laser light of a second beam diameter that is smaller than the first beam diameter thereby forming a second portion of the dot.

8 Claims, 6 Drawing Sheets

(58) Field of Classification Search
CPC ..... H01L 21/02008; H01L 2223/54453; H01L 21/67282; H01L 2223/5442; H01L 2223/54493
See application file for complete search history.

(56) References Cited

FOREIGN PATENT DOCUMENTS

| | | |
|---|---|---|
| JP | H09-223648 A | 8/1997 |
| JP | H10-156560 A | 6/1998 |
| JP | 2001-230165 A | 8/2001 |
| JP | 2011-029355 A | 2/2011 |
| JP | 2011-187706 A | 9/2011 |
| TW | 200720001 A | 6/2007 |
| TW | 201637762 A | 11/2016 |

OTHER PUBLICATIONS

International Search Report issued in International Patent Application No. PCT/JP2019/0335200, dated Nov. 2019, along with an English translation thereof.

Japanese Office Action issued in Japanese Patent Appl. No. 2018-198503, dated Nov. 8, 2019, along with an English translation thereof.

Taiwanese Office Action issued in Taiwanese Patent Appl. No. 108132398, dated May 18, 2020, along with an English translation thereof.

International Preliminary Report Patentability (IPRP) issued in International Pantent Appl. No. PCT/JP2019/035200 dated Apr. 27, 2021 issued by the World Intellectual Property Organization(WIPO).

\* cited by examiner

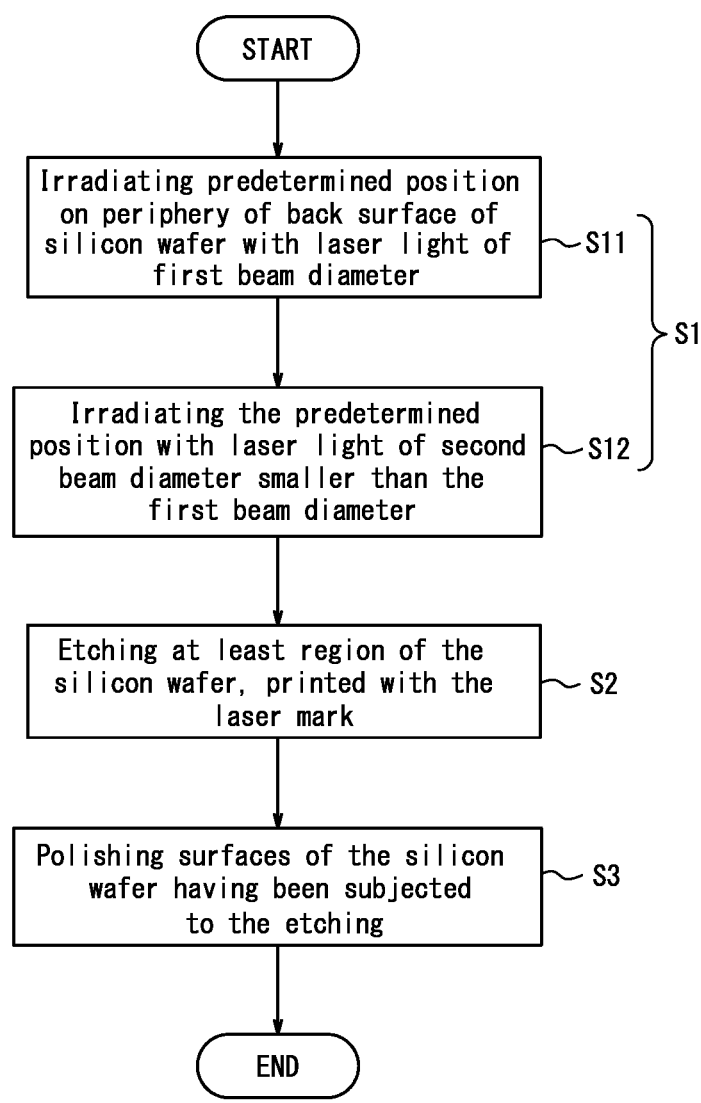

FIG. 3

| | Cross-sectional shape of dot |
|---|---|
| Conventional Example | 101.9 μm |
| Example | 109.0 μm / 64.5 μm / 13.8 μm |

FIG. 4

| | Cross-sectional shape of dot |
|---|---|
| Conventional Example | 107.2 μm |
| Example | 142.4 μm / 89.7 μm / 10.2 μm / 19.0° |

FIG. 5
| | Cross-sectional shape of dot |
|---|---|
| Conventional Example | 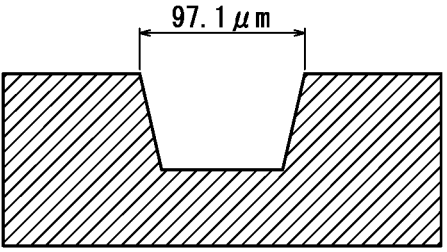 |
| Example | 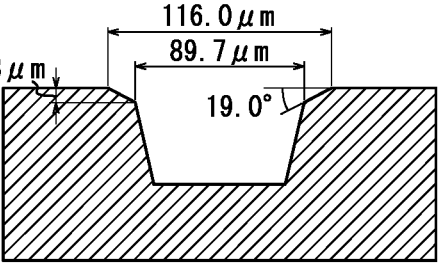 |

METHOD OF PRODUCING LASER-MARKED SILICON WAFER AND LASER-MARKED SILICON WAFER

TECHNICAL FIELD

This disclosure relates to a method of producing a laser-marked silicon wafer and a laser-marked silicon wafer.

BACKGROUND

Conventionally, silicon wafers are widely used as substrates for semiconductor devices. Such silicon wafers are produced in the following manner. First, a single crystal silicon ingot grown, for example, by the Czochralski (CZ) process is cut into blocks. The periphery of each block is ground and the block is then sliced.

Next, a silicon wafer obtained by the slicing is subjected to beveling and one or more of processes such as lapping, surface grinding, and double-disc grinding as appropriate. The periphery of the front surface or the back surface of the silicon wafer having been subjected to the above processes may be printed with an identification code (mark) for management or identification of wafers by irradiation with laser light. The mark printed using laser light (hereinafter referred to as "laser mark") is constituted by characters and symbols each depicted with a set of a plurality of recesses (dots) and is of a size such that it can be identified visually or using a camera or the like.

The irradiation with the above laser light forms a ring-shaped raised area around each dot. Accordingly, at least a laser-mark printed region of the silicon wafer printed with the laser mark (hereinafter also referred to as "laser mark region") is subjected to etching to remove the above raised area, followed by polishing on the surface of the silicon wafer (for example, see JP 2011-029355 A (PTL 1)). Subsequently, the polished silicon wafer is subjected to final cleaning. The silicon wafers are subjected to a variety of inspections and ones that meet predetermined quality standards are shipped as products.

CITATION LIST

Patent Literature

PTL 1: JP 2011-029355 A

SUMMARY

Technical Problem

As described above, the raised area around each dot, formed when the laser mark is printed is removed by etching. However, when a silicon wafer having been subjected to polishing was inspected, raised areas were found to have been formed around the dots. In recent years, as semiconductor devices are increasingly miniaturized and integrated, the silicon wafers are required to be very flat. Further, device formation regions are also increasingly expanded in the radially outward direction of wafers year by year, so the wafer peripheries are also required to have high flatness. The raised areas around the dots reduce the flatness of the wafer periphery.

It could therefore be helpful to provide a method of producing a laser-marked silicon wafer with no raised area around dots constituting a laser mark after polishing and a laser-marked silicon wafer.

Solution to Problem

We propose the following features to address the above problem.

1. A method of producing a laser-marked silicon wafer, comprising:

a laser mark printing step of printing a laser mark having a plurality of dots on a silicon wafer obtained by slicing a single crystal silicon ingot grown by a predetermined method;

an etching step of performing etching on at least a laser-mark printed region in a surface of the silicon wafer; and a polishing step of performing polishing on both surfaces of the silicon wafer having been subjected to the etching step, wherein in the laser mark printing step, each of the plurality of dots is formed by a first step of irradiating a predetermined position on a periphery of the silicon wafer with laser light of a first beam diameter thereby forming a first portion of the dot and a second step of irradiating the predetermined position with laser light of a second beam diameter that is smaller than the first beam diameter thereby forming a second portion of the dot, and the first step is performed so that the first portion has a depth such that at least a part of the first portion is left after the polishing step.

2. The method of producing a laser-marked silicon wafer according to (1) above, wherein the first beam diameter is more than 100% and 120% or less of the second beam diameter.

3. The method of producing a laser-marked silicon wafer according to (1) or (2) above, wherein the first step is conducted by performing irradiation with laser light a plurality of times.

4. The method of producing a laser-marked silicon wafer according to any one of claims 1 to 3, wherein the second step is conducted by performing irradiation with laser light a plurality of times.

5. A laser-marked silicon wafer comprising a laser mark having a plurality of dots on a periphery of a surface of the silicon wafer, wherein each of the dots has a first portion defined by a first wall and a second portion defined by a second wall and a bottom surface, the second portion being provided in a position deeper than the first portion from the surface of the silicon wafer, and a tilt angle of the first wall with respect to the surface of the silicon wafer is smaller than a tilt angle of the second wall.

6. The laser-marked silicon wafer according to (5) above, wherein the silicon wafer surface is mirror-polished.

7. The laser-marked silicon wafer according to (5) or (6) above, wherein a depth of the first portion is more than 0 μm and 23 μm or less.

Advantageous Effect

This disclosure allows for the production of a laser-marked silicon wafer with no raised area around dots constituting the laser mark after polishing.

BRIEF DESCRIPTION OF THE DRAWINGS

In the accompanying drawings:

FIG. 1 is a flowchart of a method of producing a laser-marked silicon wafer according to this disclosure;

FIG. 3 is a schematic cross-sectional view of dots after respective laser mark printing steps;

FIG. 4 is a schematic cross-sectional view of dots after respective etching steps;

FIG. 5 is a schematic cross-sectional view of dots after respective polishing steps.

DETAILED DESCRIPTION (Method of Producing Laser-Marked Silicon Wafer)

Embodiments of this disclosure will now be described with reference to the drawings. FIG. 1 presents a flowchart of a method of producing a laser-marked silicon wafer according to this disclosure. The method of producing a laser-marked silicon wafer includes: a laser mark printing step of printing a laser mark having a plurality of dots on a silicon wafer obtained by slicing a single crystal silicon ingot grown by a predetermined method (Step S1); an etching step of performing etching on at least a laser-mark printed region in a surface of the silicon wafer (Step S2); and a polishing step of performing polishing on both surfaces of the silicon wafer having been subjected to the etching step (Step S3). Here, each of the plurality of dots is formed by a first step of irradiating a predetermined position on a periphery of the silicon wafer with laser light of a first beam diameter thereby forming a first portion of the dot (Step S11) and a second step of irradiating the predetermined position with laser light of a second beam diameter that is smaller than the first beam diameter thereby forming a second portion of the dot (Step S12). The first step is performed so that the first portion has a depth such that at least a part of the first portion is left after the polishing step.

As described above, the raised area around each dot, formed when the laser mark is printed on the periphery of the silicon wafer is treated by etching. Nevertheless, raised areas are found to be formed around the dots after the polishing.

Figure 2A:
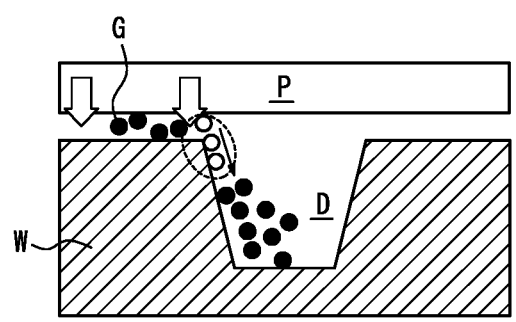
FIGS. 2A to 2D are diagrams illustrating the mechanism of the improvement in the flatness of a wafer periphery according to this disclosure.
Figure 2B:
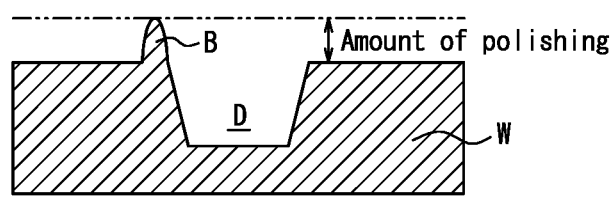

The inventor of this disclosure has intensively studied the causes of the formation of the raised areas. Thus, the inventor considered that abrasive grains acting around the dots in the polishing are insufficient. Specifically, the inventor considered that, as illustrated in FIGS. 2A and 2B, when a surface of a silicon wafer W is polished while a polishing slurry is supplied to the space between a polishing pad P and the silicon wafer W, abrasive grains G contained in the polishing slurry fall into a dot D, which causes the lack of abrasive grains around the dot D (FIG. 2A), and thus the amount of polishing on the rim of the dot D is smaller than the polishing amount of the other part, resulting in the formation of a raised area B around the dot D (FIG. 2B).

This being the case, the inventor intensively studied the ways to prevent the formation of the raised area B around the dot D based on the above assumption and found that it is significantly advantageous to form each of the plurality of dots D by a first step of irradiating a predetermined position on a periphery of the silicon wafer with laser light of a first beam diameter and a second step of irradiating the predetermined position with laser light of a second beam diameter that is smaller than the first beam diameter.

Figure 2C:
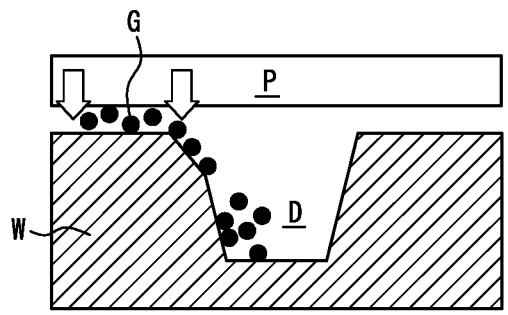

The two stages of laser light irradiation with different beam diameters form a dot including a first portion having a relatively large diameter and a second portion having a relatively small diameter. From the studies the inventor has made, it was found that when etching is performed on the silicon wafer on which such dots are formed, a wall tilted a little is formed in the first portion closer to the surface of the wafer W (FIG. 2C).

The mechanism that hinders the formation of the raised area B is not necessarily clear; however, the wall tilted a little as described above is considered to restrain the abrasive grains G from falling into a deep position in the dot D and increase the abrasive grains G dwelling in the circumferential periphery of the dot D, hindering the formation of the raised area B.

Figure 2D:
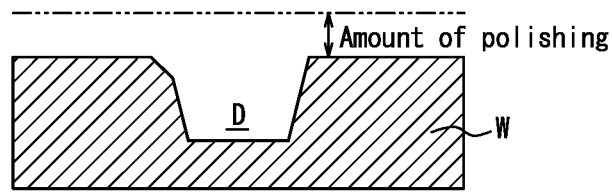

Further, the inventor found that, in the first step described above, the formation of the raised area B can be prevented by forming the first portion at a depth such that at least a part of the first portion is left after the polishing step (FIG. 2D). This suggests that the wall tilted a little can be prevented from being eliminated through polishing from the start to the end, which will hinder the abrasive grains G contained in the polishing slurry from falling into a deep position of the dot D.

As described above, the inventor found that the raised area B around the dot D can be prevented from being formed by performing the step of printing a laser mark by a plurality of stages of irradiation with laser light of different beam diameters in such a manner that the first portion formed by irradiation with laser light of a relatively large beam diameter is formed so that at least a part of the first portion is left after the polishing step. Each step will be described below.

First, in Step S1, a laser mark having a plurality of dots is printed on a silicon wafer obtained by slicing a single crystal silicon ingot grown by a predetermined method (laser mark printing step).

The laser mark printing step is performed specifically through the following two steps. First, in Step S11, a predetermined position on a periphery of the silicon wafer is irradiated with laser light of a first beam diameter D1 (first step). This results in the formation of an opening having a first diameter D1 and a first depth d1 in the predetermined position on the periphery of the silicon wafer (first portion).

Note that the opening may be formed in either the front surface or the back surface of the wafer. Further, the first diameter D1 of the opening means the diameter in the outermost surface of the wafer. Meanwhile, the first depth d1 means the depth from the wafer surface to the deepest part of the opening.

The above silicon wafer used may be one obtained by performing known wafer edge grinding, slicing, and beveling and one or more processes such as lapping, surface grinding, and double-disc grinding as appropriate on a single crystal silicon ingot grown by the CZ process or the floating zone (FZ) process.

In the growth of the single crystal silicon ingot, the oxygen concentration, the carbon concentration, the nitrogen concentration, and the like can be suitably adjusted so that the silicon wafer cut out of the grown silicon ingot will have the desired characteristics. Further, suitable dopants may be added to obtain a wafer having a conductivity type of n-type or p-type.

A laser source used may be, for example, an infrared laser, a $CO_2$ laser, or a YLF laser (solid-state laser). Of these, a YLF laser is preferably used, since thermal damage can be reduced.

The beam diameter of the laser light applied to the silicon wafer can be controlled by controlling the power of the laser light or the current value, and the beam diameter can be made larger by increasing the power of the laser light. In the first step, the irradiation is performed with laser light of the first beam diameter that is larger than the second beam diameter in the second step to be described, thereby forming the opening having the first diameter D1 and the first depth d1 (first portion) in the predetermined position on the periphery of the silicon wafer.

The depth of the opening formed by a single irradiation with laser light does not depend on the power of the laser light, and is for example approximately 4 μm/irradiation although depending on the apparatus used. In cases where an opening having the above first depth d1 cannot be obtained by a single irradiation with laser light, the opening having the above first depth d1 can be formed by performing irradiation with laser light a plurality of times in the first step.

In this disclosure, it is important that the above first depth d1 is a depth such that at least a part of the opening provided in the first step will be left after polishing to be performed. This allows the first portion having a relatively large diameter to always have the part of the wall tilted a little as depicted in FIG. 2C from the start to the end of the subsequent polishing step, thus the formation of a raised area can be prevented.

Further, in terms of obtaining a shape similar to a surface at a small angle that is formed by etching before the etching, the upper limit of the first depth d1 is preferably 50% or less of the second depth d2 of the opening formed after the second step to be described. Here, the second depth d2 is the depth of a part of the opening newly formed in the second step in the opening formed in the first step, and is not the depth from the wafer surface.

Next, in Step S12, the above-mentioned predetermined position that has been irradiated with laser light in the first step is irradiated with laser light of a second beam diameter D2 that is smaller than the first beam diameter (second step). Thus, an opening having the second diameter D2 and the second depth d2 is formed in the opening having the first diameter D1 and the first depth d1 that has been formed in the first step. The second diameter D2 is smaller than the first diameter D1.

As with the first step, in cases where an opening having the above second depth d2 cannot be obtained by a single irradiation with laser light, the opening having the above second depth d2 can be formed by performing irradiation with laser light a plurality of times in the second step.

The ratio of the first beam diameter with respect to the second beam diameter (D1/D2) is preferably more than 100% and 120% or less. More preferably, the ratio is 105% or more and 120% or less. This increases the effect of preventing a raised area from being left after the polishing step to be performed.

Thus, the opening having the first diameter D1 and depth of the first depth d1 plus the second depth d2 in the predetermined position on the periphery of the silicon wafer. In this specification, an opening formed in this manner is referred to as a dot. A laser mark can be printed by repeating the first step and the second step in different positions to form a plurality of dots.

In the above description, one dot is formed by performing the first step and the second step and then another dot is formed; alternatively, the first step may be first performed on all the dot formation positions and then the second step may be performed similarly.

Further, in the above description, the second step is performed after performing the first step; alternatively, the first step may be performed after performing the second step. In this case, an opening having a second diameter D2 and a second depth d2 is first formed in the second step, and an opening having a first diameter D1 larger than the second diameter D2 and a first depth d1 is then formed in the subsequent first step. Here, in the first step, since the opening formed in the second step is also irradiated with laser light, the depth of the opening after the first step is deeper by d1 and the total opening depth is d1+d2; consequently, a dot substantially the same as one formed by performing the second step after performing the first step can be formed.

Note that surface portions of the silicon wafer are removed in the etching step and the polishing step to be performed, thus the diameter and the depth of each dot are changed. Accordingly, in the first step and the second step, the beam diameter and the depth of the opening to be provided in each step are set as appropriate so that a silicon wafer having been subjected to the polishing step can have a laser mark having a plurality of dots with the diameter of a final product and the depth of the final product.

After the above laser printing step, etching is performed on at least a laser-mark printed region in a surface of the silicon wafer in Step S2 (etching step). In this etching step, a surface portion of the silicon wafer that includes the inside of the dot formed by irradiation with laser light in Step S1 is removed and a raised area formed around the dot is also removed. Further, this etching step can also eliminate warpage of the silicon wafer caused by lapping.

A method of etching in which the silicon wafer printed with the laser mark is immersed and kept in an etchant charged into an etching tank and is etched while rotating the wafer can be given as an example of the above etching step.

As the etching solution, an alkaline etchant is preferably used, and an etchant that is an aqueous solution of sodium hydroxide or potassium hydroxide is more preferably used. This etching step removes the raised area around each dot constituting the laser mark and can also eliminate warpage of the silicon wafer caused by lapping.

After the above etching step, in Step S3, polishing is performed on the surfaces of the silicon wafer having been subjected to the etching step (polishing step). In this polishing step, both surfaces of the wafer having been subjected to etching are polished using a polishing slurry containing abrasive grains. Thus, the surfaces of the silicon wafer are mirror-polished.

In this polishing step, mirror-polishing is performed on both surfaces of the silicon wafer by setting the silicon wafer in a carrier; holding the wafer between an upper plate and a lower plate to each of which a polishing cloth is attached; flowing a slurry, for example, colloidal silica, into the space between the upper and lower plates and the wafer; and rotating the upper and lower plates and the carrier plate in opposite directions. Thus, irregularities on the surfaces of the wafer can be reduced, so that a highly flat wafer can be obtained.

Specifically, an alkaline slurry containing colloidal silica as abrasive grains is used as the polishing slurry.

After the above polishing step, one-side finish polishing in which at least one of the surfaces of the silicon wafer is finish-polished one by one is performed. The finish polishing includes both polishing of only one surface and polishing of both surfaces. When both surfaces are polished, one surface is polished first and the other surface is then polished.

Subsequently, after the finish polishing, the silicon wafer having been subjected to polishing is cleaned. Specifically, particles, organic matter, metal, etc. on the wafer surfaces are removed using, for example, an SC-1 cleaning solution that is a mixture of aqueous ammonia, a hydrogen peroxide solution, and water, or an SC-2 cleaning solution that is a mixture of hydrochloric acid, a hydrogen peroxide solution, and water.

Finally, the flatness of the cleaned silicon wafer, the number of LPDs on the wafer surface, damage, contamination of the wafer surface, etc. are examined. Only silicon wafers which meet predetermined quality requirements in those examinations are shipped as products.

Thus, a laser-marked silicon wafer with no raised area around dots constituting the laser mark after polishing can be produced.

(Laser-Marked Silicon Wafer)

A laser-marked silicon wafer according to this disclosure will now be described. A laser-marked silicon wafer according to this disclosure is a laser-marked silicon wafer including a laser mark having a plurality of dots on the periphery of a surface of the wafer, the wafer being produced by the method described above. Here, each of the dots has a first portion defined by a first wall and a second portion defined by a second wall and a bottom surface, the second portion being provided in a position deeper than the first portion from the surface of the silicon wafer; and the tilt angle of the first wall with respect to the surface of the silicon wafer is smaller than the tilt angle of the second wall.

As described above, in the laser mark printing step, a raised area can be prevented from being formed around the dots constituting the laser mark. Accordingly, the laser-marked silicon wafer according to this disclosure has no raised area around the dots constituting the laser mark, and is a silicon wafer such that the flatness of the wafer periphery is higher than the flatness of the periphery of conventional wafers and the surface of the wafer is mirror-polished.

Further, the depth of the first portion of a laser-marked silicon wafer according to this disclosure is preferably more than 0 µm and 23 µm or less.

EXAMPLES

The silicon wafer according to this disclosure will be described below with reference to a specific example and a specific conventional example; however, this disclosure is not limited to these examples.

Example

According to the flowchart given in FIG. 1, a silicon wafer having a diameter of 116 µm and a depth of 58 µm, provided with a laser mark having a plurality of dots was prepared. First, a single crystal silicon ingot with a diameter of 300 mm, grown by the CZ process was cut into blocks, and one of the blocks was subjected to wafer edge grinding and was then sliced to obtain a (100) silicon wafer. Next, a laser mark was printed on the periphery of the back surface of the silicon wafer obtained. Specifically, using a YLF laser as a laser light source, in the first step, irradiation was performed with light of a target diameter 110 µm and a target depth of 4 µm under a condition of laser power: 3000 µJ, performed seven times and in the second step, irradiation was then performed with light of a target diameter 65 µm and a target depth of 4 µm under a condition of laser power: 1500 µJ, performed seven times. Consequently, dots having a first portion with a diameter of 109.0 µm and a second portion with a diameter of 64.5 µm as depicted in FIG. 3 were formed.

Figure 4:
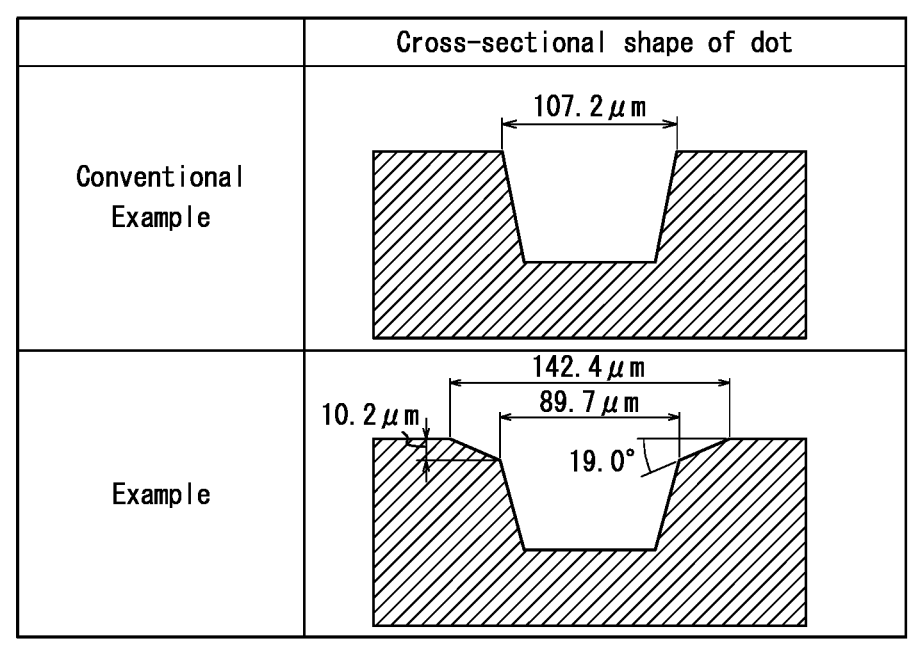

Next, etching was performed on the silicon wafer printed with the laser mark. Specifically, a 48% aqueous solution of sodium hydroxide was used as an etchant, and the amount removed by etching was 15 µm. A schematic view of one of the dots after etching is given in FIG. 4.

After that, the silicon wafer having been subjected to etching was subjected to double-side polishing. Specifically, mirror-polishing was performed on both surfaces of the silicon wafer by setting the silicon wafer having been subjected to etching in a carrier; holding the wafer between an upper plate and a lower plate to each of which a polishing cloth is attached; flowing an alkaline polishing slurry containing colloidal silica into the space between the upper and lower plates and the wafer; and rotating the upper and lower plates and the carrier plate in opposite directions. The amount removed by the double-side polishing was 5 µm per one surface. A schematic view of one of the dots after polishing is given in FIG. 5. As is apparent from FIG. 5, a part of the first portion was left after the polishing.

Subsequently, after performing finish polishing on the silicon wafer having been subjected to the above polishing, cleaning was performed, thus a laser-marked silicon wafer according to this disclosure was obtained. Five laser-marked silicon wafers were prepared under the above conditions.

Conventional Example

A laser-marked silicon wafer was prepared as in Example. Note however that each of the plurality of dots constituting a laser mark was formed by irradiation with light of a target diameter 100 µm and a target depth of 4 µm under a condition of laser power: 1500 µJ, performed 14 times. All the other conditions were the same as those in Example. Schematic views of dots after laser mark printing, etching, and polishing are given in FIG. 3, FIG. 4, and FIG. 5, respectively.

<Surface Profile Measurement of Dot>

For the laser-marked silicon wafers obtained in Example and Conventional Example described above, the surface profile of the dots constituting the laser mark was measured. Specifically, the height of the rims of all the dots were measured using a measurement system (WaferSight2 manufactured by KLA-Tencor Corporation).

Figure 6:
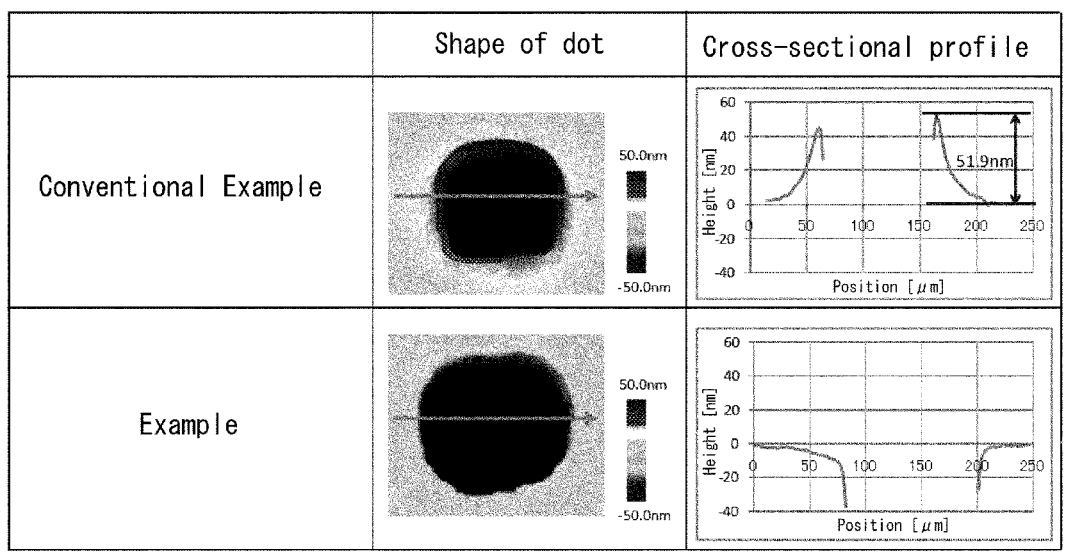
FIG. 6 is a diagram illustrating the surface profile of dots.

FIG. 6 illustrates the surface profiles of the dots constituting the laser marks of the silicon wafers prepared as described above in Example and Conventional Example. As apparent from FIG. 6, in Conventional Example, a raised area having a height exceeding 50 nm was formed around the dot. By contrast, in Example, a raised area was not formed and the rim of the dot receded, and a part of the first portion formed in the first step was found to be left. This demonstrates that this disclosure makes it possible to obtain a laser-marked silicon wafer with no raised area around dots.

INDUSTRIAL APPLICABILITY

This disclosure allows for the production of a laser-marked silicon wafer with no raised area around dots constituting the laser mark after polishing; accordingly, the disclosed silicon wafer and the disclosed production method are useful in the semiconductor wafer manufacturing industry.

REFERENCE SIGNS LIST

B: Raised area
D: Dot (Recess)
G: Abrasive grains
P: Polishing pad
W: Silicon wafer

The invention claimed is:

1. A method of producing a laser-marked silicon wafer, comprising:
a laser mark printing step of printing a laser mark having a plurality of dots on a silicon wafer obtained by slicing a single crystal silicon ingot grown by a predetermined method;
an etching step of performing etching on at least a laser-mark printed region in a surface of the silicon wafer; and
a polishing step of performing polishing on the surface of the silicon wafer having been subjected to the etching step,
wherein in the laser mark printing step, each of the plurality of dots is formed by a first step of irradiating a predetermined position on a periphery of the silicon wafer with laser light of a first beam diameter thereby forming a first portion of the dot and a second step of irradiating the predetermined position with laser light of a second beam diameter that is smaller than the first beam diameter thereby forming a second portion of the dot, and
the first step of irradiating is performed so that the first portion has a depth such that at least a part of the first portion is left after the polishing step.

2. The method of producing the laser-marked silicon wafer according to claim 1, wherein a ratio of the first beam diameter with respect to the second beam diameter is between 100% and 120%.

3. The method of producing the laser-marked silicon wafer according to claim 1, wherein the first step of irradiating is conducted by performing irradiation with laser light a plurality of times.

4. The method of producing the laser-marked silicon wafer according to claim 1, wherein the second step of irradiating is conducted by performing irradiation with laser light a plurality of times.

5. The method of producing the laser-marked silicon wafer according to claim 2, wherein the first step of irradiating is conducted by performing irradiation with laser light a plurality of times.

6. The method of producing the laser-marked silicon wafer according to claim 2, wherein the second step of irradiating is conducted by performing irradiation with laser light a plurality of times.

7. The method of producing the laser-marked silicon wafer according to claim 3, wherein the second step of irradiating is conducted by performing irradiation with laser light a plurality of times.

8. The method of producing the laser-marked silicon wafer according to claim 5, wherein the second step of irradiating is conducted by performing irradiation with laser light a plurality of times.

* * * * *